(12) United States Patent
Kusunoki

(10) Patent No.: US 6,993,090 B2
(45) Date of Patent: Jan. 31, 2006

(54) DISTORTION COMPENSATION APPARATUS AND DISTORTION COMPENSATION METHOD

(75) Inventor: Shigeo Kusunoki, Kanagawa (JP)

(73) Assignee: Sony Corporation, Tokyo (JP)

( * ) Notice: Subject to any disclaimer, the term of this patent is extended or adjusted under 35 U.S.C. 154(b) by 852 days.

(21) Appl. No.: 09/963,257

(22) Filed: Sep. 26, 2001

(65) Prior Publication Data

US 2002/0061074 A1    May 23, 2002

(30) Foreign Application Priority Data

Sep. 29, 2000    (JP) ............................ P2000-301405

(51) Int. Cl.
*H04L 25/03*    (2006.01)
(52) U.S. Cl. ...................... 375/296; 375/297; 455/126; 330/149
(58) Field of Classification Search ................ 375/254, 375/285, 296, 297, 332, 346; 330/86, 149, 330/278, 282; 332/159–162; 455/63.1, 455/126
See application file for complete search history.

(56) References Cited

U.S. PATENT DOCUMENTS

| 4,329,655 | A |   | 5/1982 | Nojima et al. ............... 330/149 |
| 4,985,688 | A |   | 1/1991 | Nagata ........................ 332/123 |
| 4,987,378 | A |   | 1/1991 | Eggleston et al. ........... 330/149 |
| 4,999,583 | A | * | 3/1991 | Washburn et al. ............. 330/86 |
| 5,121,077 | A |   | 6/1992 | McGann ....................... 330/149 |
| 5,770,971 | A |   | 6/1998 | McNicol |
| 5,781,069 | A |   | 7/1998 | Baskin |
| 6,275,685 | B1 | * | 8/2001 | Wessel et al. ................ 455/126 |

FOREIGN PATENT DOCUMENTS

| EP | 1011192  | 6/2000 |
| JP | 08125554 | 5/1996 |
| JP | 10270951 | 9/1998 |

* cited by examiner

*Primary Examiner*—Young T. Tse
*Assistant Examiner*—Edith Chang
(74) *Attorney, Agent, or Firm*—Jay H. Maioli

(57)    ABSTRACT

A method and apparatus for compensating for a distortion component of a device such as a power amplifier can be achieved without requiring a demodulator. A voltage controlling a gain of the amplitude of the input signal based on the amplitude control signal generated in the amplitude control signal generation step.

25 Claims, 12 Drawing Sheets

DISTORTION COMPENSATION APPARATUS AND DISTORTION COMPENSATION METHOD

BACKGROUND OF THE INVENTION

1. Field of the Invention

The present invention relates to a distortion compensation apparatus and particularly to a distortion compensation apparatus and a distortion compensation method which are applicable to a high-frequency power amplifier for transmission used in a portable phone.

2. Description of Related Art

As the communication has come to have a higher speed and a larger capacity in recent years, stricter linearity has been required for a transmission power amplifier in a digital wireless communication apparatus. It has simultaneously causes a situation that improvements in power efficiency in a power amplifier are prevented.

Meanwhile, the continuous communication time of a digital portable phone which has already spread in the general market has been steadily elongated. Therefore, in introduction of a new digital wireless communication apparatus into the market, the use time cannot be neglected, from the viewpoint of competition among products. Today, the movement of introducing a distortion compensation technique to improve the efficiency has become active.

In this technique, however, its circuit scale is too huge to realize it in a portable phone whose advantage exists its small size and light weight. In addition, due to characteristics of a portable terminal, the environment in which the terminal is used changes so greatly that distortion compensation necessitates adaptive distortion compensation which follows the environmental change. This has become a very important problem, as well as downsizing. For a distortion compensation apparatus of this kind, a pre-distortion technique provided with a compensation means having a characteristic opposite to the distortion of a power amplifier has been known.

As pre-distortion techniques of this kind, there are several reports about a technique which adopts pre-distortion, a technique which adopts feed-forward, and the like. The following will explain examples of conventional adaptive distortion compensation apparatuses using the pre-distortion technique.

A first example of a conventional structure is, for example, 1992. European Microwave Conference, Vol. 22, pp. 1125–pp. 1130, "Power Amplifier Adaptive Linearization Using Predistortion with Polynomial." FIG. 1 shows a block diagram of the example disclosed in this reference.

In FIG. 1, where the non-linear input/output characteristic of a power amplifier (PA) 114 whose distortion should be compensated for is expressed as Vout=A(Vin), an in-phase signal I and an orthogonal signal Q of an input base band inputted from an input terminal 111 are subjected to calculation using a function H (I, Q) which linearizes A (Vin), in a linearization comparator circuit 112. I' and Q' signals obtained as a result are supplied to digital/analogue conversion circuit (D/A) 113, and are converted into analogue signals. At the same time, they are converted into signals of a high frequency band, and are inputted to the power amplifier 114. The output Vout of the power amplifier 114 is outputted from an output terminal 115, and is also supplied to a demodulation circuit 116. The demodulation circuit 116 generates If and Qf signals into which the output signal Vout is converted into signals of a base band.

Further, to perform adaptive compensation in response to a temperature change, the linearization comparator circuit 112 compares I and Q signals with If and Qf signals and adjusts a constant included in the function H for linearization such that the differences among them become zero. Until the differences become zero, this operation is repeated so that the constant included in the function H (I, Q) is finally determined to an optimal value.

An example of another conventional structure is, for example, IEEE Transaction on Vehicalar Technologies, Vol. 43, No. 2, May 1994, pp.323–pp.332. "Adaptive Linearization Using Predistortion". FIG. 2 shows a block diagram described in this reference. With respect to input signals I and Q inputted from an input terminal 121, a conversion table 124 such as a memory or the like is accessed thereby to perform data conversion, to obtain data I' and Q' which are capable of linearizing the power amplifier 126. The data are converted into analogue signals by a D/A converter 125 and are then inputted to the power amplifier 126. The output Vout thereof is detected and converted into a signal of a base band by a demodulation circuit 128, to obtain signals If and Qf. Further, to perform adaptive compensation, differences en between the input signals I and Q and the detection signals If and Qf are obtained by a subtracter 122. An address generation section 123 adjusts addresses in the conversion table 124 such that the differences en become zero. Specifically, the address generation section 123 repeats adjustment of the addresses until the differences en correctly become zero. Thus, address values for accessing the conversion table 124 are optimized. Further, Vin, which is obtained by converting data I' and Q' outputted from the conversion table 124 into analogue data by the D/A converter 125, is inputted to the power amplifier 126, and the output Vout thereof is guided from an output terminal 127.

In the conventional structures described above, the constant included in a linearization function or addresses for accessing a linearization table are optimized. In any examples, however, the output of the power amplifier is converted into a base band, so a demodulator is required. In general, this demodulator is of orthogonal demodulation, and therefore, its circuit scale is huge.

SUMMARY OF THE INVENTION

The present invention has been made in view of the above situation and has an object of providing a distortion compensation apparatus and method which are capable of easily compensating for distortion components in a device such as a power amplifier.

Also, the present invention has another object of providing a distortion compensation apparatus and method which are capable of constructing a simple structure which does not need the demodulator.

According to the present invention, a distortion compensation apparatus for compensating for a distortion component generated in a device comprises first envelope detection means for detecting an envelope voltage of an input signal supplied to the device, second envelope detection means for detecting an envelope voltage of an output signal of the device, comparison means for comparing the envelope voltage detected by the first envelope detection means with the envelope voltage detected by the second envelope detection means, comparison result correction means for correcting a relationship concerning a result of comparison made by the comparison means, as to which of the envelope voltages is larger/smaller, amplitude control signal generation means for generating an amplitude control signal for controlling an amplitude of the input signal, based on a correction output of the comparison result; and amplitude control means for controlling a gain of the amplitude of the input signal, based on the amplitude control signal generated by the amplitude control signal generation means.

In the distortion compensation apparatus, the amplitude control signal generation means includes amplitude correction data output means for outputting data for amplitude correction, in correspondence with the envelope voltage detected by the first envelope detection means, and for updating data for amplitude correction, based on the correction output of the comparison result correction means.

DESCRIPTION OF THE PREFERRED EMBODIMENTS

In the following, an adaptive distortion compensation apparatus as an embodiment of the distortion compensation apparatus and distortion compensation method according to the present invention will be explained with reference to the drawings. This adaptive distortion compensation apparatus serves to compensate for distortion of a high-frequency power amplifier (hereinafter described as a power amplifier) for transmission in a digital wireless communication apparatus.

Figure 1:
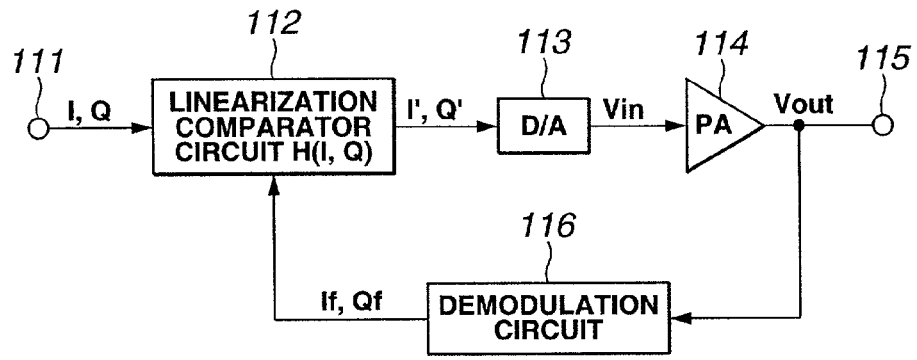
FIG. 1 is a block diagram showing a first example of prior art.
Figure 2:
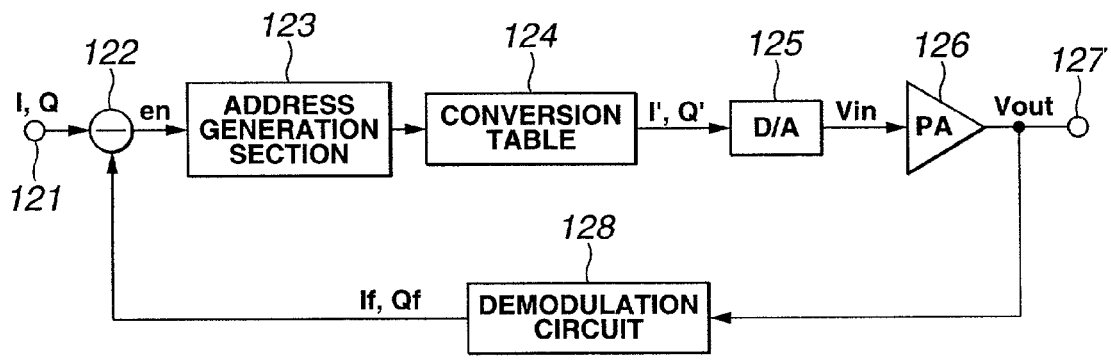
FIG. 2 is a block diagram showing a second example of prior art.
Figure 3:
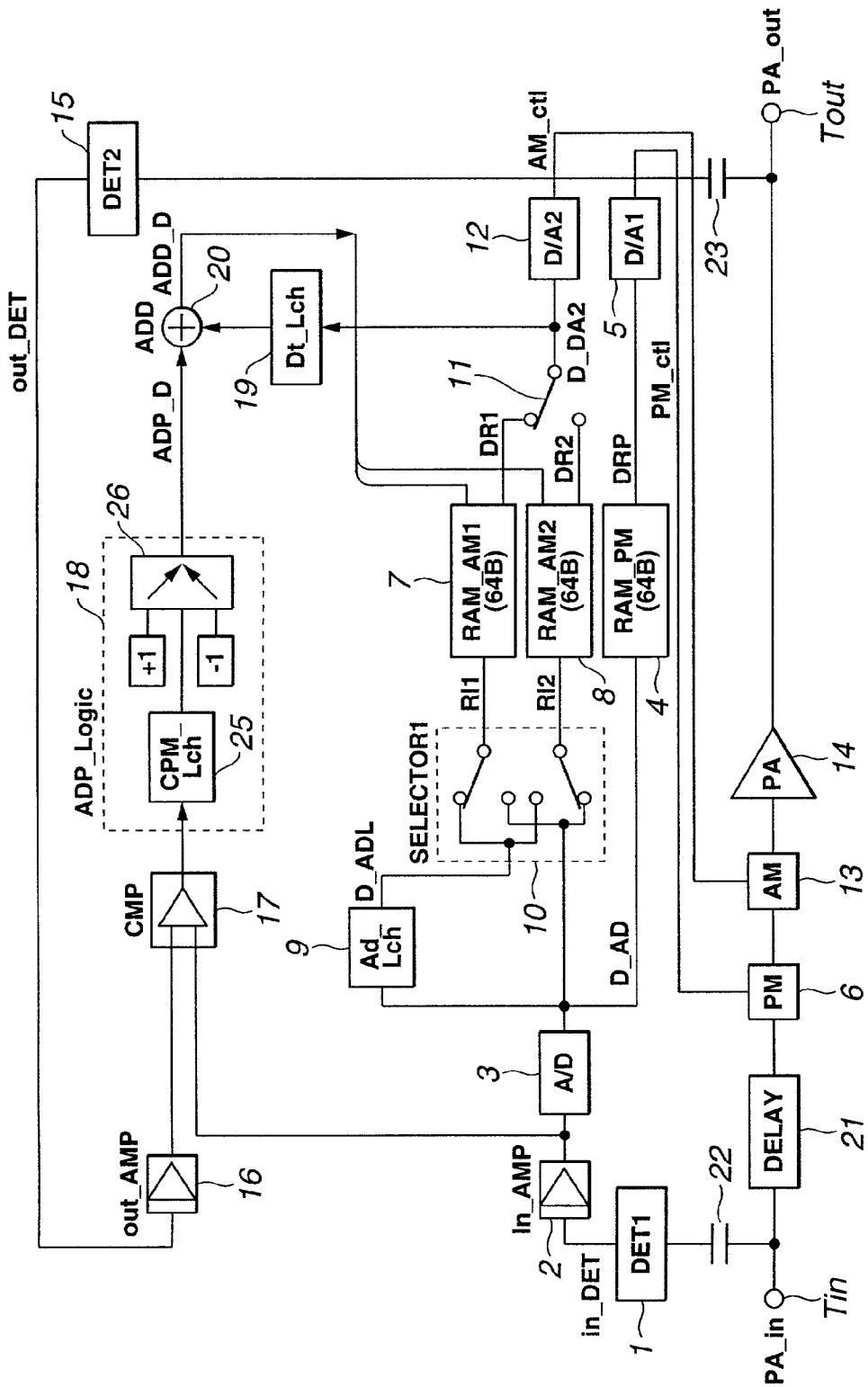
FIG. 3 is a structural view showing an adaptive distortion compensation apparatus according to the distortion compensation apparatus and the method thereof as the first embodiment of the present invention.

At first, a structure which forms main part of the adaptive distortion compensation apparatus will be explained with reference to FIG. 3. This adaptive distortion compensation apparatus comprises a first envelope detection section (DET 1)1, a second envelope detection section (DET 2) 15, a voltage comparator (CMP) 17, a logic (ADP_Logic) section 18, an amplitude control signal generation means, and a gain control section 13. The first envelope detection section (DET 1) detects an envelope voltage in_DET of a high-frequency signal PA_in having an envelope change, which is supplied to the power amplifier 14. The second envelope detection section (DET 2) 15 detects an envelope voltage out_DET of an output signal PA_out of the power amplifier 14. The voltage comparator (CMP) 17 compares the envelope voltage detected by the first envelope detection section 1 with the envelope voltage detected by the second envelope detection section 15. The logic section (ADP_Logic) 18 corrects the relationship in magnitude, which is detected by the voltage comparator 17. The amplitude control signal generation means generates an amplitude control signal AM_ct1 for controlling the amplitude of the input signal PA_in, based on the corrected output of the logic section 18. The gain control section 13 controls the gain of the amplitude of the input signal PA_in, based on the amplitude control signal generated by the amplitude control signal generation means.

The amplitude control signal generation means is constructed by two amplitude compensation memories 7 and 8 described later, a latch circuit 9, a selector 10, a selector 11, a D/A converter 12, a latch circuit 19, and a digital adder 20.

Explained next will be the details of the structure of this adaptive distortion compensation apparatus. As shown in FIG. 3, this apparatus comprises: a first envelope detection section (DET 1) 1 for receiving, through a capacitor 22, a part of the high-frequency signal PA_in having an envelope change, which is supplied to an input terminal Tin, and for detecting the envelope voltage in_DET thereof; a voltage amplifier (In_AMP) 2 for amplifying the envelope voltage in_DET detected by the first envelope detection section 1; an A/D converter 3 for digitizing the output of the voltage amplifier 2 and for outputting a digital signal D_AD; a phase correction memory (RAM_PM) 4 which is inputted with the digital signal D_AD, as an address, outputted from the A/D converter 3, and which outputs phase correction data DRP corresponding to the address, from data previously stored for phase correction; a first D/A converter 5 for performing D/A conversion on the phase correction data DRP outputted from the phase correction memory 4, and for outputting a phase control signal PM_ct1; a latch circuit (Ad_Lch) 9 for latching the digital signal D_AD outputted from the A/D converter 3; a first amplitude compensation memory (RAM_AM 1) 7 which has an input end RI1 and an output end DR1, and which stores previously data for amplitude correction; a second amplitude compensation memory (RAM_AM 2) 8 which has an input end RI2 and an output end DR2 and which previously stores data for amplitude correction, too; a first selector (Selector1) 10 which is inputted with a latch output D_ADL of the latch circuit 9 as a first input as well as the digital signal D_AD of the A/D converter 3 as a second input, and which switches and connects the digital signal D_AD to the input end RI1 as well as the latch output D_ADL to the input end RI2, or the digital signal D_AD to the input end RI2 as well as the latch output D_ADL to the input end RI1; a second selector (Selector2) 11 which is inputted with the output DR1 of the first amplitude compensation memory 7 as a first input and the output DR2 of the second amplitude compensation memory 8 as a second input, and which selects and outputs either one of the inputs, as data D_DA2; a second D/A (D/A2) converter 12 which is inputted with the data D_DA2 selected and outputted by the second selector 11, and which performs D/A conversion thereon, to output an amplitude control signal AM_ct1; a second envelope detection section (DET 2) 15 which is inputted through a capacitor 23 with a part of the output of the power amplifier (PA) 14 as a target whose distortion should be compensated for by the adaptive distortion compensation apparatus, and which detects an envelope out_DET therefore; a voltage amplifier (out_AMP) 16 for amplitude which detects an envelope out_DET by the second envelope detection section 15; a voltage comparator (CMP) 17 which is inputted with the output of the voltage amplifier 16 as a first input as well as the output of the voltage amplifier 2 as a second input, and which detects which of the inputs is larger/smaller; a logic (ADP_Logic) section 18 which latches the output of the voltage comparator 17 and which outputs a digital+1 bit or digital−1 bit as a signal ADP_D, depending on the latch value; a data latch circuit (Dt_Lch) 19 which latches the data D_DA2 selected by the second selector 11; a digital adder (ADD) 20 which digitally adds the output of the data latch circuit 19 and the output ADP_D of the logic section 18 to each other, and which connects an addition result ADD_D thereof to a write data bus of the amplitude compensation memories 7 and 8; a delay element (Delay) 21 which delays the input signal PA_in; a phase control section (PM) 6 which is inputted with the output of the delay element 21 as an input and which increases/decreases its passing phase by the phase control signal PM_ct1; a gain control section (AM) 13 which is inputted with the output of the phase control section 6, and which increases/decreases its gain by the amplitude control signal AM_ct1 outputted from the second D/A converter 12; and a power amplifier (PA) 14 which is inputted with the output of the gain control section 13, and which outputs the signal PA_out through an output terminal Tout.

Explained next will be the flow of a signal in the adaptive distortion compensation apparatus shown in FIG. 3. In this adaptive distortion compensation apparatus, the first envelope detection section 1 detects an envelope voltage in_DET from a part of the high-frequency signal PA_in having a change in its envelope. Further, with the envelope voltage in_DET is amplified by the voltage amplifier 2, and is thereafter digitized by the A/D converter 3. The memory is accessed with the digital signal D_AD outputted from this A/D converter 3 used as an address of the phase correction memory 4, and phase correction data DRP corresponding to this address is outputted from the data previously stored for phase correction. This is subjected to D/A conversion by the first D/A converter 5, to output phase control data PM_ct1. The phase control section 6 is controlled by this phase control data PM_ct1.

Amplitude correction data is previously stored in the first amplitude compensation memory 7 and the second amplitude compensation memory 8. The output D_ADL obtained by latching the digital signal D_AD of the envelope voltage by the latch circuit 9 or the output D_AD of the A/D converter 3 is switched by the first selector 10 and used as the address of each memory. In addition, the output DR1 of the amplitude compensation memory 7 and the output DR2 of the amplitude compensation memory 8 are switched from each other by the second selector 11, to be connected alternately to the second D/A converter 12. The gain of the gain control section 13 is controlled by the output AM_ct1 of the second D/A converter 12.

The second envelope detection section 15 detects the envelope voltage out_DET of the output of the power amplifier 14 whose distortion should be compensated. This envelope voltage out_DET is amplified by the power amplifier 16, to form one input to the voltage comparator 17. Another input of the voltage comparator 17 is supplied with the envelope voltage in_DET detected by the first envelope detection section 1 and amplified by the voltage amplifier 2. The voltage comparator 17 compares the two envelope voltages. Further, the logic section 18 latches the voltage as a comparison result thereof and outputs a digital+1 or −1 bit as a signal ADP_D, depending on the latched value. This signal ADP_D is supplied to the digital adder 20. This digital adder 20 is also supplied with an output selected by the second selector 11 and latched by the latch circuit 19. Further, the digital adder 20 digitally adds the signal ADP_D and the latch output to each other, and writes the addition result ADD_D thereof into the data bus of the amplitude compensation memories 7 and 8.

The input signal PA_in passes through the delay element 21, the phase control section 6, and the gain control section 13, and is then amplified by the power amplifier 14. In this while, the phase and amplitude of the signal PA_in are corrected by the phase control section 6 and the gain control section 13, and the signal is then inputted to the power amplifier 14. As a result, an output signal PA_out whose distortion has been compensated is obtained from the output terminal Tout.

Next, specific explanation will be made of the amplitude compensation, phase correction, and adaptive compensation which are performed by the adaptive distortion compensation apparatus described above.

Described firstly will be amplitude correction data necessary for amplitude compensation.

The envelope voltage of the input signal PA_in is expressed as Vi (t). The envelope voltage of output of the gain control section 13 is expressed as Vpd (t), and the voltage of the gain control signal AM_ct1 added to the control terminal of this gain control section 13 is expressed as Vc (t). This voltage Vc (t) is stored in the amplitude compensation memories 7 and 8.

Suppose that the gain G (vc) of the gain control section 13 is expressed as follows with a conversion coefficient a.

$$G(vc)=1+a*Vc(t) \tag{1}$$

Since the following equation is given.

$$Vpd(t)=Vi(t)*G(vc) \tag{2}$$

The equation (2) is substituted into the equation (1) to obtain the following equation.

$$Vpd(t)=Vi(t)*(1+a\ Vc(t))$$

Hence, the following equation is obtained.

$$Vc(t)=(1/a)*(Vpd(t)/Vi(t)-1) \tag{3}$$

The envelope voltage Vpd (t) can be obtained by measuring the input/output characteristic with respect to the power amplifier 14 whose distortion should be corrected. Therefore, the result obtained by calculating the expression (3) described above may be previously stored into the amplitude compensation memories 7 and 8 with use of the envelope voltage Vpd (t).

Next, phase correction data necessary to perform phase correction will be described.

Suppose that the phase characteristic of the power amplifier is as follows.

$$\Phi=\Phi(Vi(t)) \tag{4}$$

The phase correction data Φpd becomes as follows.

$$\Phi pd = -\Phi(V1(t)) \quad (5)$$

This data is previously stored into the phase correction memory 4.

Next explanation will be made of the amplitude compensation operation using the amplitude compensation memories 7 and 8.

The amplitude compensation memories 7 and 8 store amplitude correction data corresponding to addresses. Each address is a signal D__AD obtained by digitizing an inputted envelope signal in__DET. The amplitude compensation memories 7 and 8 output data DR1 and DR2 corresponding to the address. Since there are two kinds of addresses for accessing the two phase compensation memories 7 and 8. One is an output D__AD of the A/D converter 3 and the other is data D__ADL obtained by latching and holding the output of this A/D converter 3 by the latch circuit 9. Both types are switched by the first selector 10, to access alternately the two amplitude compensation memories 7 and 8. Further, the memory connected with the address D__ADL latched by the latch circuit 9 is in a memory write mode, and the memory connected with the output D__AD of the A/D converter 3 is in a memory read mode. The output data DR1 or DR2 from the memory in the read mode is connected with the D/A converter 12 by the second selector 11, to form the amplitude control signal AM__ct1.

Next explanation will be made of a phase correction operation using the phase correction memory 4. The digital signal D__AD described above is used as an address for the amplitude compensation memories 7 and 8 and is also used simultaneously as an address for the phase correction memory 4, to output data previously stored for phase correction, as phase correction data DRP. This data is subjected to A/D conversion by the first D/A converter 5, to output a phase control signal PM__ct1, and thus, the phase control section 6 is controlled.

Next explanation will be made of adaptive compensation operation.

If there is no change in temperature or the like, distortion of the power amplifier 14 is compensated for only by the operation of reading amplitude compensation data from the memory for amplitude compensation. However, if a change occurs in temperature or the like, this compensation is not satisfactory so that a mechanism is required to respond to the change.

For this purpose, in the present invention, the envelope voltage of the output PA__out of the power amplifier 14, which has been corrected by the amplitude control signal AM__ct1 outputted from the amplitude correction memory 4, and the envelope voltage before the correction are compared with each other, to detect the relationship as to which of the voltages is larger/smaller. Further, data in the amplitude compensation memory is updated so as to correct the relationship. At this time, one bit of the data in the memory is updated by every one set of operation. Therefore, the data is corrected to a proper value by accessing one same address sometimes. For example, if the envelope of the inputted high-frequency signal PA__in changes like a QPSK modulation wave, one same voltage appears at a certain probability on the time axis. Thus, all the addresses are corrected to proper values as the time goes. Although reading from and writing into the memories are performed alternately, two memories are used so that reading from one memory is carried out while writing into the other memory is carried out.

A specific example of the operation of the adaptive distortion compensation apparatus will be specifically explained next.

The comparator 17 compares the amplified output obtained by amplifying the envelope in__DET of the inputted high-frequency signal by the voltage amplifier 2, with the amplified output obtained by amplifying the envelope out__DET of the power amplifier 14 to be subjected distortion compensation by the voltage amplifier 16. The voltage of the comparison result is latched by the logic section 18, and a digital+1 or −1 bit is outputted as a signal ADP__D, depending on the latch value.

The data D__DA2 selected by the second selector 11 is latched by the latch circuit 19, and this latched output and the output ADP__D of the logic section 18 are digitally added to each other by the digital adder 20. An addition result ADD__D thereof is connected with and written into the write data bus of the amplitude compensation memories 7 and 8.

Figure 4:
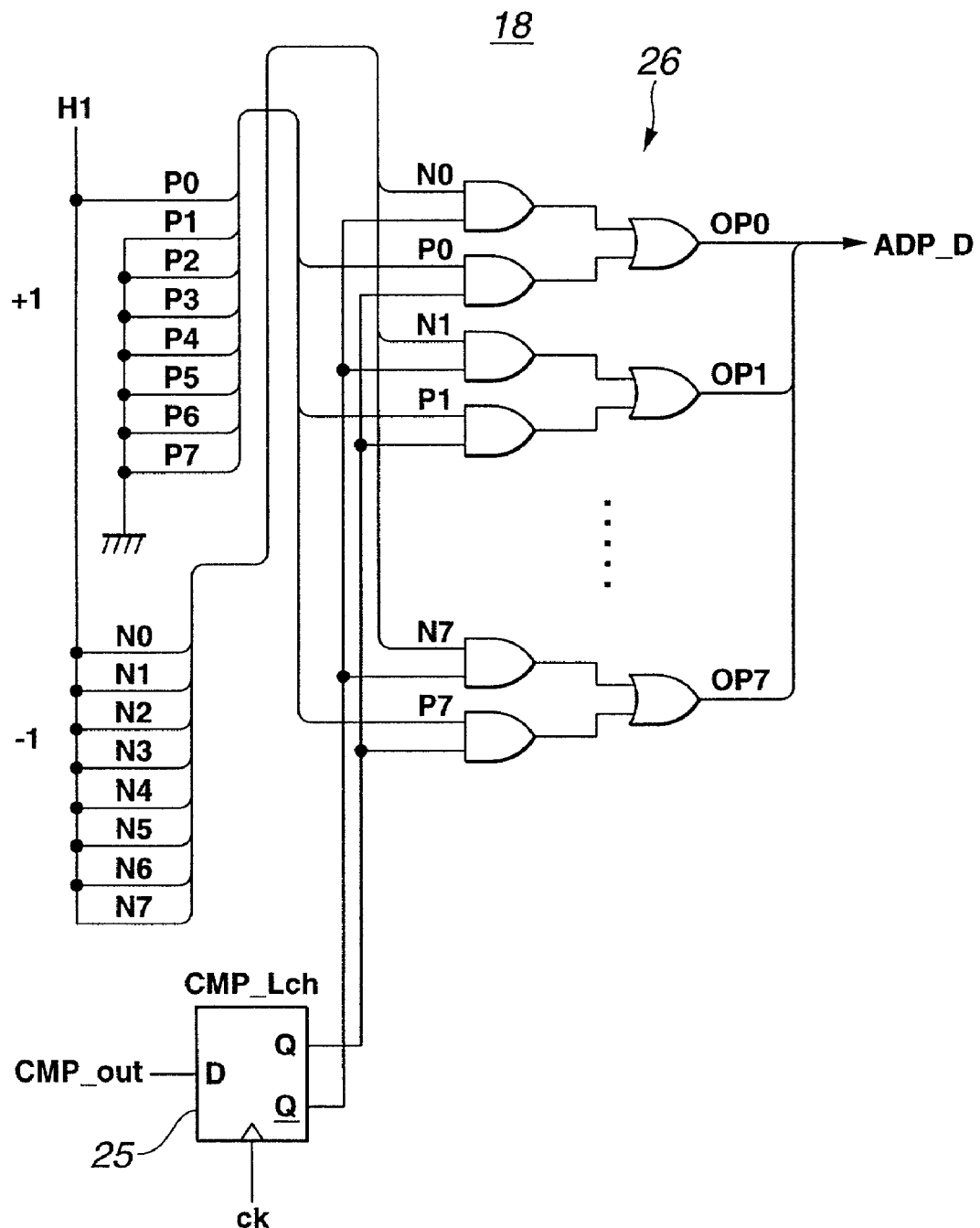
FIG. 4 is a circuit diagram showing a specific example of a logic section (ADP_Logic) which forms part of the adaptive distortion compensation apparatus as the first embodiment.

FIG. 4 shows a specific example of the logic (ADP__Logic) section 18. The output signal CMP__out of the comparator (CMP) 17 is latched by the D__latch circuit (CMP__1ch) 25. The D__latch circuit 25 performs latching at the edges of the clock ck. This specific example supposes 8-bit data. By the digital+1, only MSB is set to Hi, as shown in the figure, and the other is set to Lo. By the digital−1, all bits are set to Hi. These data are inputted to the digital selector 26 constructed by an AND gate and an OR gate, and any one is outputted to OP0 to OP7, depending on values of Q and Q__as outputs of the D__latch circuit 25. This data forms the ADP__D.

Figure 5:
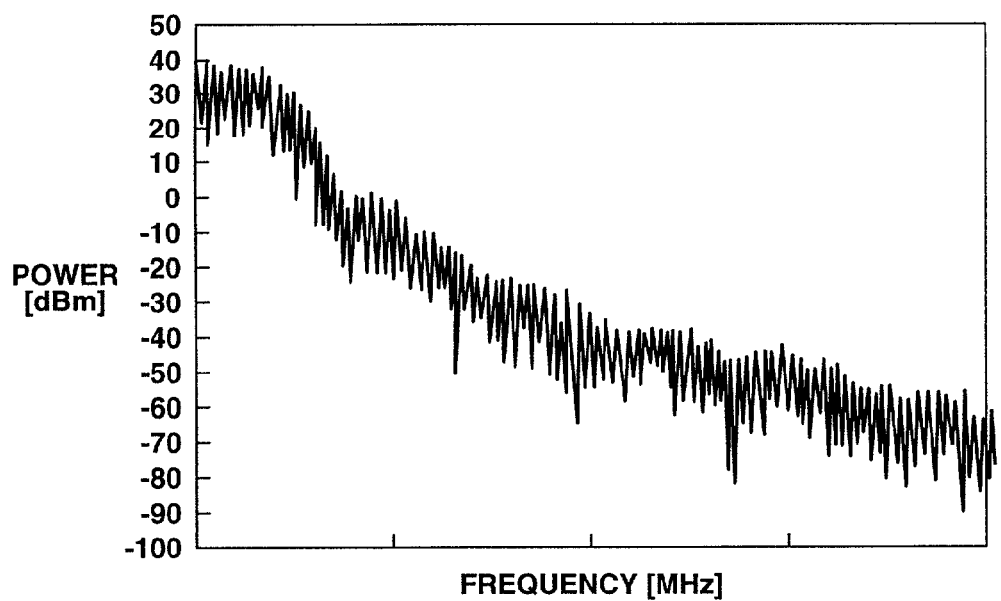
FIG. 5 is a spectrum characteristic graph of distortion generated by a power amplifier.
Figure 6:
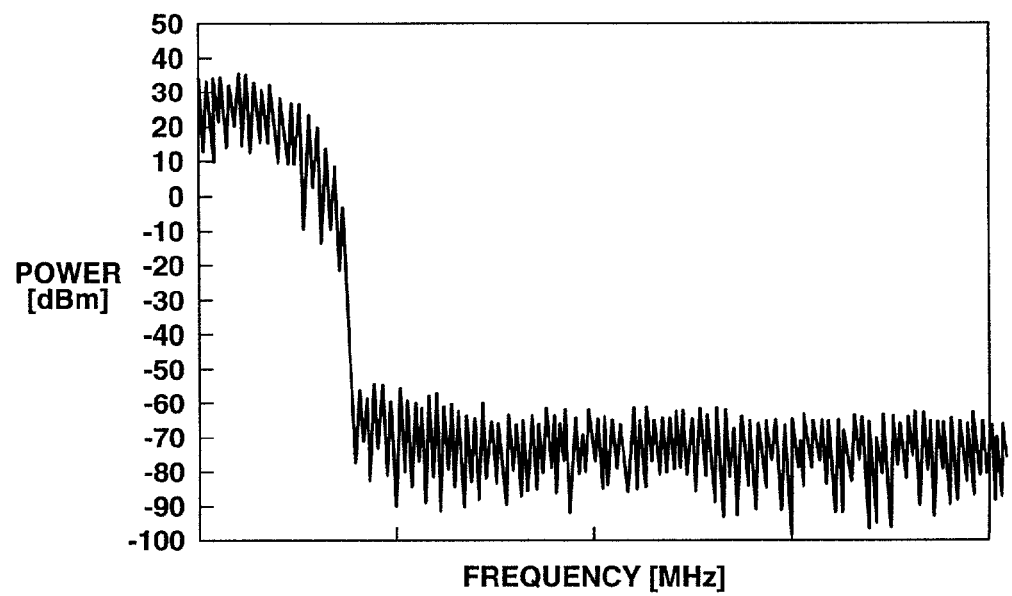
FIG. 6 is a spectrum characteristic graph showing a result of distortion compensation at a room temperature.

FIGS. 5 and 6 show a result of practicing the adaptive distortion compensation apparatus as the first embodiment. FIGS. 5 and 6 shows an example of the distortion compensation where the temperature is at 25 degrees (room temperature). FIG. 5 shows a spectrum containing distortion generated by the power amplifier 14. FIG. 6 shows a spectrum obtained by adaptive distortion compensation by the amplitude compensation memories 7 and 8 and the phase correction memory 4.

Figure 7:
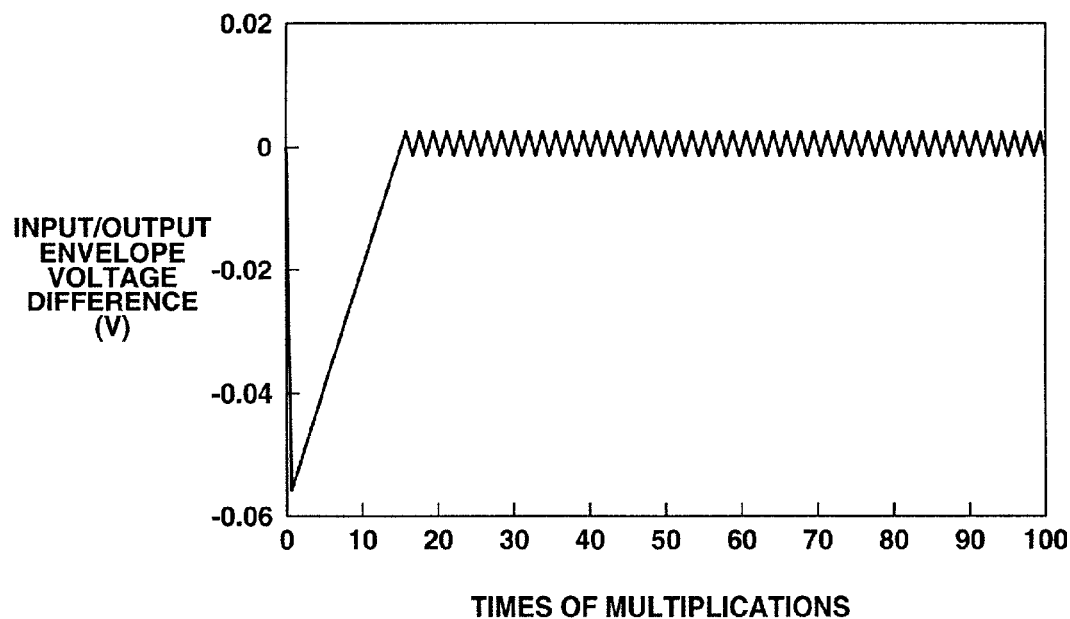
FIG. 7 is a characteristic graph showing a result of adaptive compensation at −30 degrees.
Figure 8:
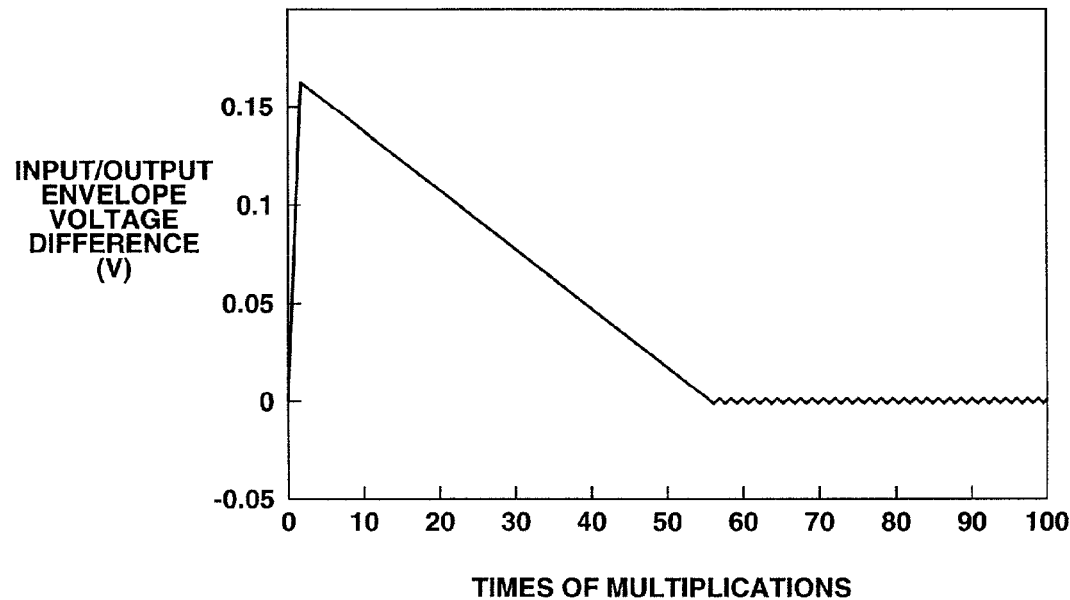
FIG. 8 is a characteristic graph showing a result of adaptive compensation at 80 degrees.

FIGS. 7 and 8 show results of adaptive compensation. FIG. 7 shows an example at −30 degrees. In the figure, the ordinate expresses the difference between the envelope voltages of input and output, and the abscissa expresses the number of times at which multiplication is carried out. It can be found that, as the number of times of multiplications increases, the difference between the envelope voltages decreases.

FIG. 8 shows a state of adaptive compensation where the temperature is at 80 degrees. In the high temperature side, a result appears in that the gain of the power amplifier 14 decreases, so that the loop gain of the feedback loop which constructs an adaptive route decreases, thereby increasing the number of times of multiplications which are necessary to reduce the distortion power.

Furthermore, FIG. 7 shows that an increase of the gain causes the difference between the input and output envelope voltages to be converged from the negative direction, in the low temperature side. However, in FIG. 8, due to the gain reduction in the high temperature side, the difference is converged from the positive side on the contrary to FIG. 7.

Figure 9:
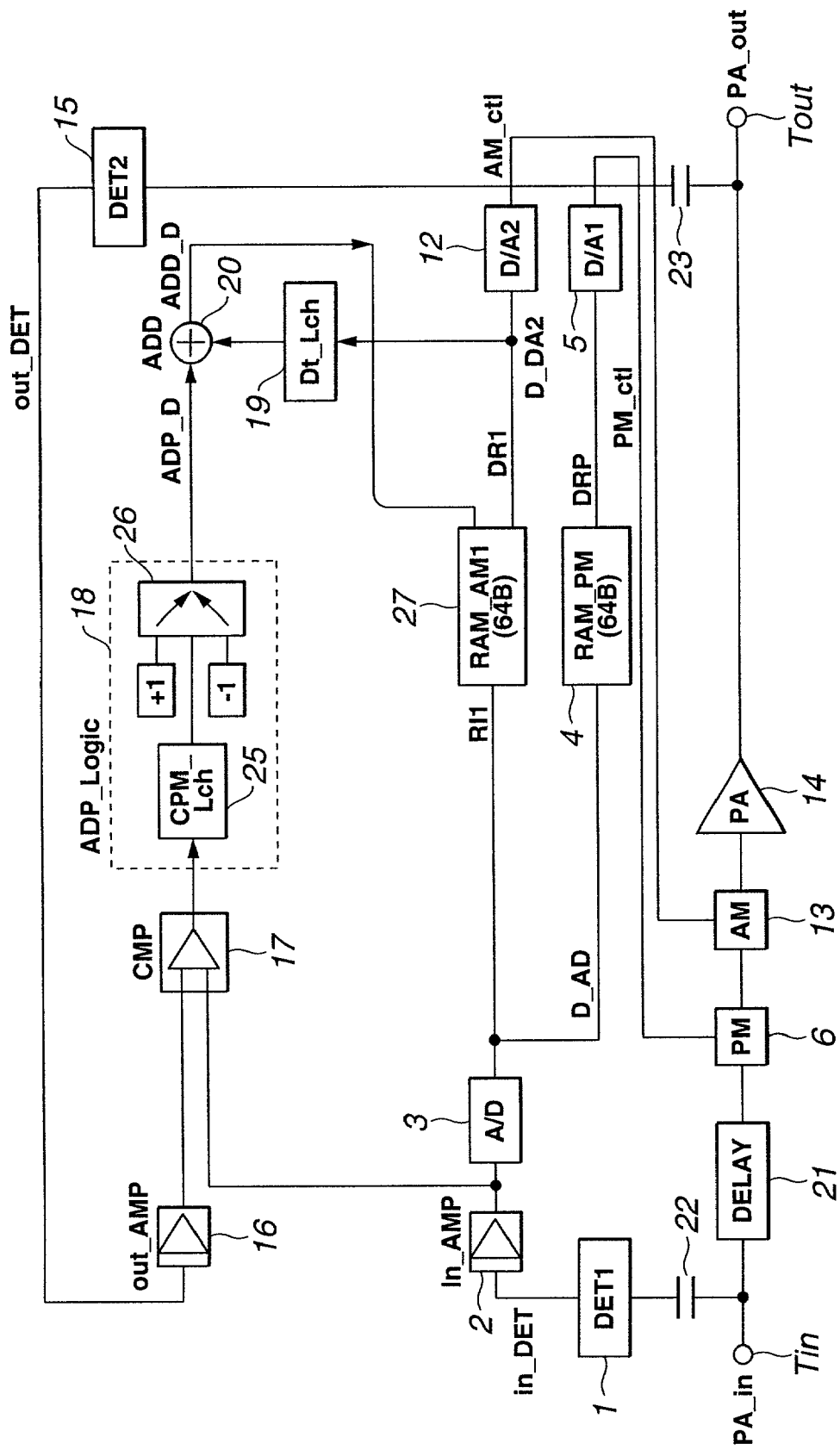
FIG. 9 is a structural view showing the adaptive distortion compensation apparatus as the second embodiment.

Next explanation will be made of an adaptive distortion compensation apparatus as a second embodiment. FIG. 9 shows the structure of the adaptive distortion compensation apparatus of the present second embodiment. The adaptive distortion compensation apparatus of the second embodiment differs from the adaptive distortion compensation apparatus previously shown in FIG. 3 of the first embodiment in that two memories used for amplitude compensation are replaced with only one amplitude compensation memory 27. Thus, the two selectors 10 and 11 which are required for switching the two memories in FIG. 3 and the one latch circuit 9 are removed.

That is, the latch circuit 9 and the first selector 10 are removed from the first embodiment described above, and the output D_AD of the A/D converter 3 is supplied to the address bus of the amplitude compensation memory 27. Also, the second selector 11 in the first embodiment is removed, and the data bus of the amplitude compensation memory 27 and the second D/A converter 12 are connected to each other.

The operation of the adaptive distortion compensation apparatus of the second embodiment will now be explained. In the adaptive distortion compensation apparatus of the first embodiment, it appears that reading of compensation data and writing of correction data for adaptive compensation are carried out simultaneously by using two amplitude compensation memories 7 and 8. However, in the second embodiment, reading and writing are carried out by one amplitude compensation memory 27, depending on time. In this manner, the circuit structure is simplified advantageously although the output of the compensation data is suppressed by one timing compared with the first embodiment.

Figure 10:
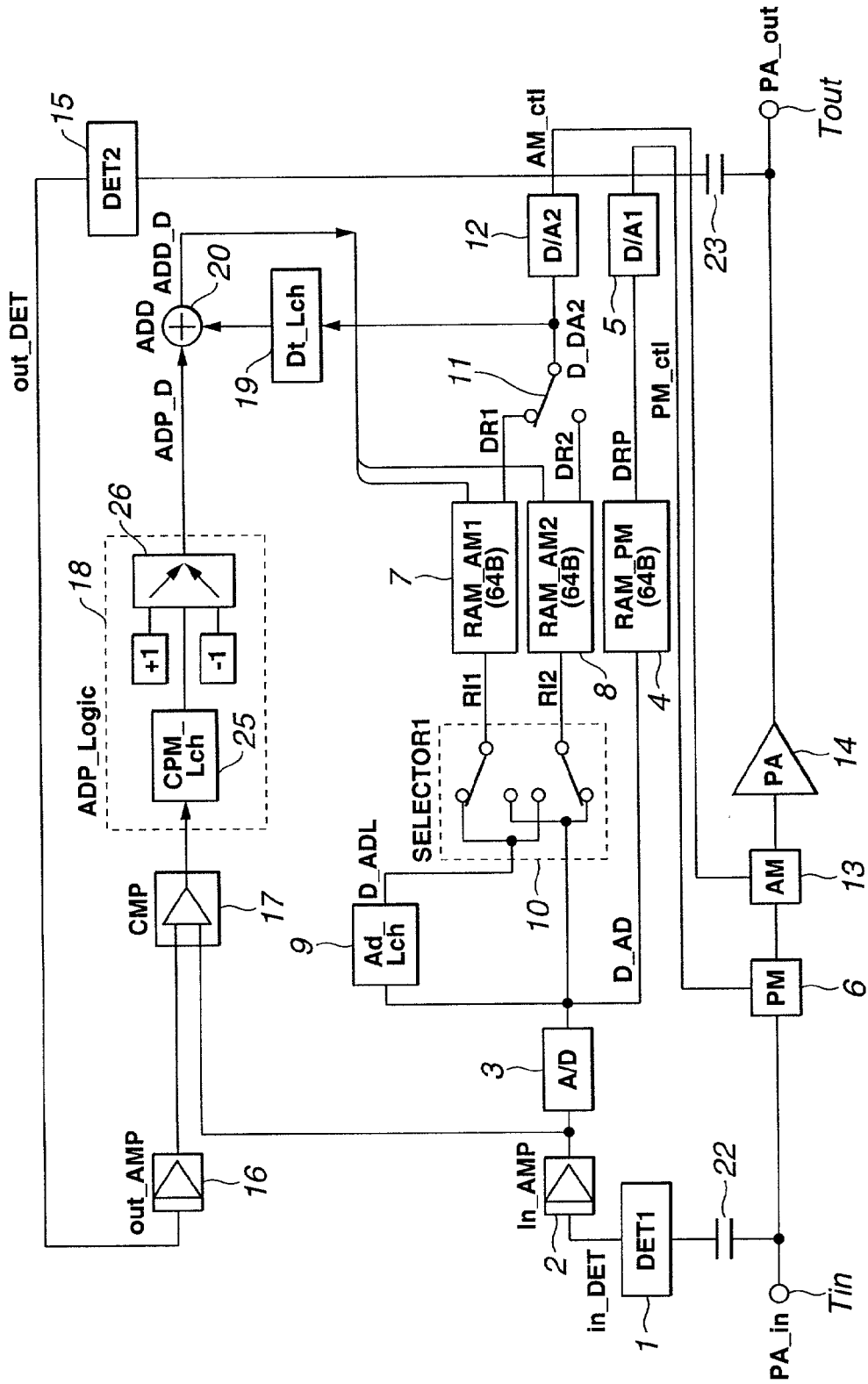
FIG. 10 is a structural view showing the adaptive distortion compensation apparatus as the third embodiment.

Next, a third embodiment will be explained. FIG. 10 shows a block diagram of the adaptive distortion compensation apparatus as the third embodiment. The adaptive distortion compensation apparatus of the present third embodiment is achieved by removing the delay element 21 used in the adaptive distortion compensation apparatus of the first embodiment. In FIG. 3, the delay element 21 is provided to correct the time lag between the control signals AM_ct1 and PM_ct1 outputted through digital processing and the envelope voltages at the gain control section 13 and the phase control section 6. However, if the fluctuation velocity of the envelope is slow compared with the processing speed of a digital signal, the dime lag can be neglected, so that the structure can be simplified by removing the delay element.

Figure 11:
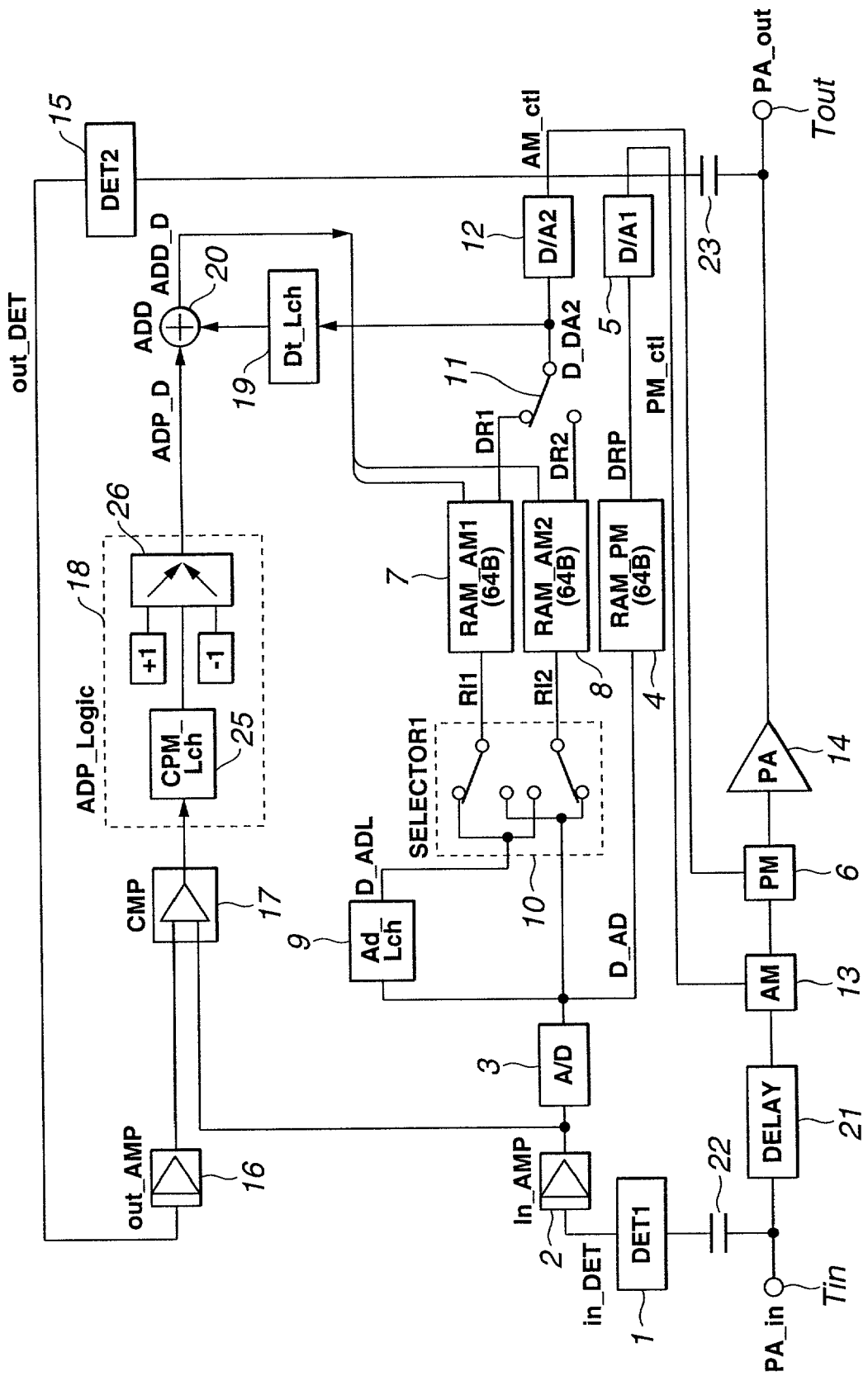
FIG. 11 is a structural view showing the adaptive distortion compensation apparatus as the fourth embodiment.

Next, a fourth embodiment will be explained. FIG. 11 shows a block diagram of the adaptive distortion compensation apparatus as the fourth embodiment. This fourth embodiment is achieved by changing the order in which the phase control section and the gain control section 13 are connected in the third embodiment. It is ideal that the passing phase of the gain control section 13 does not change with respect to the control voltage AM_ct1. However, there is a problem that the passing phase changes actually. This problem can be avoided by connecting the gain control section 13 is connected priorly so that the phase transition of the gain control section 13 is predicted, and by making a correction by the following phase control section 6.

Figure 12:
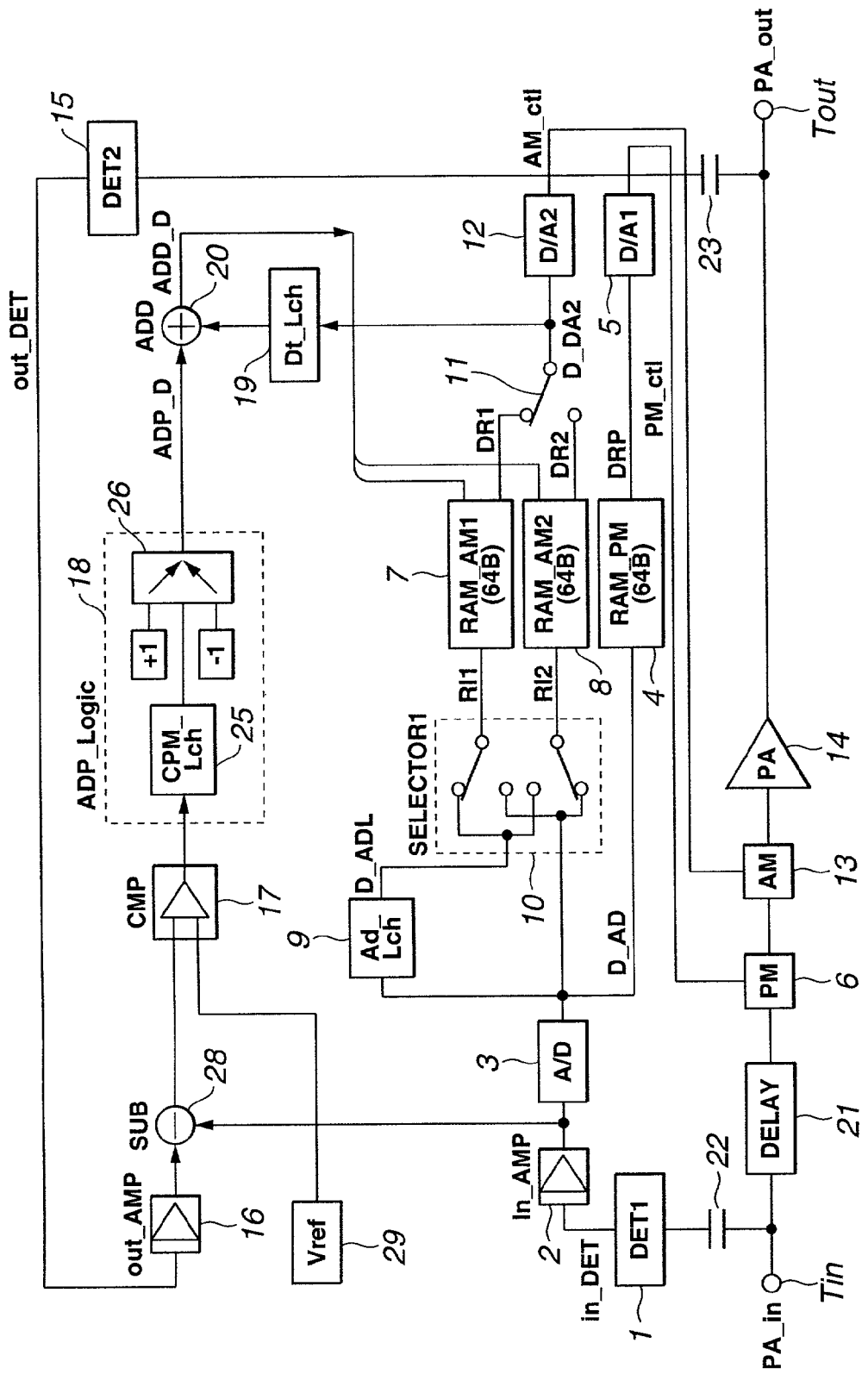
FIG. 12 is a structural view showing the adaptive distortion compensation apparatus as the fifth embodiment.

Next, a fifth embodiment will be explained. FIG. 12 shows a block diagram of the adaptive distortion compensation apparatus as the fifth embodiment. In the adaptive distortion compensation apparatus of this fifth embodiment, the outputs of the voltage amplifiers 2 and 16 are subjected to subtraction by an analogue calculator (SUB), and the result is compared with a certain reference voltage Vref1 (29) of a direct current by the comparator 17, in contrast to the third embodiment. This is effective for the case of allowing distortion to some extent to remain at the output PA_out of the power amplifier 14. In general, the distortion power does not cause problem as long as it is limited to a constant level. Therefore, remaining distortion can be tolerable to some extent. Hence, by limiting the control range, the operation time of the digital circuit can be limited so that the current consumption can be reduced advantageously.

Figure 13:
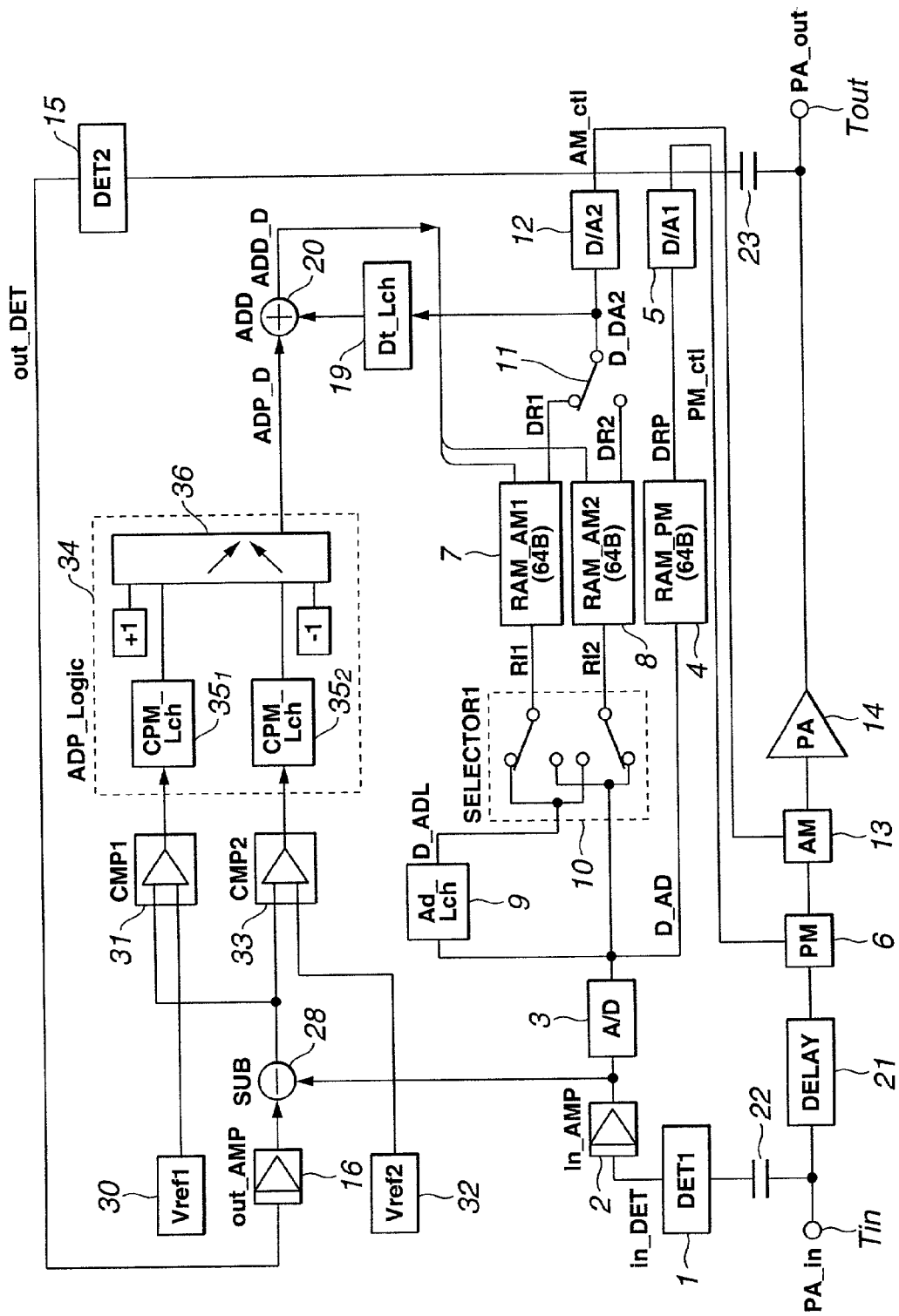
FIG. 13 is a structural view showing the adaptive distortion compensation apparatus as the sixth embodiment.

Next, a sixth embodiment will be explained. FIG. 13 shows a block diagram of the adaptive distortion compensation apparatus as the sixth embodiment. In contrast to the adaptive distortion compensation apparatus of the fifth embodiment shown in FIG. 12, the adaptive distortion compensation apparatus of the sixth embodiment prepares two comparators 31 and 33 which construct a window comparator. That is, the fifth embodiment includes a first voltage comparator (CMP1) 31, a second voltage comparator (CMP2) 33, and a logic (ADP_Logic) 34. The first voltage comparator 31 is inputted with the subtraction output of the subtraction section 28 as a first input as well as the reference voltage Vref1 (30) of a direct current as a second input, detects which of both inputs is larger/smaller, and inputs the result to the first latch (CMP_Lch1) $35_1$ of the logic section 34 described later. The second voltage comparator 33 is inputted with the subtraction output of the subtraction section 28 as a first input as well as the reference voltage Vref2 (32) as a second input, detects which of both inputs is larger/smaller, and inputs the result to the second latch (CMP_Lch2) $35_2$ of the logic section 34 described later. The logic 34 switches a digital+1 bit by the output of the first voltage comparator 31 and a digital−1 bit by the output of the second voltage comparator 33 from each other by a digital selector 36, and outputs it as data ADP_D.

The operation of adaptive compensation is carried out if the difference between the voltage amplifier 2 and the voltage amplifier 16 comes to be greater than the window voltage of the window comparator by the window comparator. That is, correction operation on the compensation data previously stored in the amplitude compensation memory is performed only if the actual distortion component increases to be equal to or greater than the window voltage. As a result, the operation time of the digital circuit is limited so that the current consumption can be reduced. Further, if distortion is small, no digital signal is applied to the gain control section 13, and therefore, digital noise can be reduced advantageously.

Figure 14:
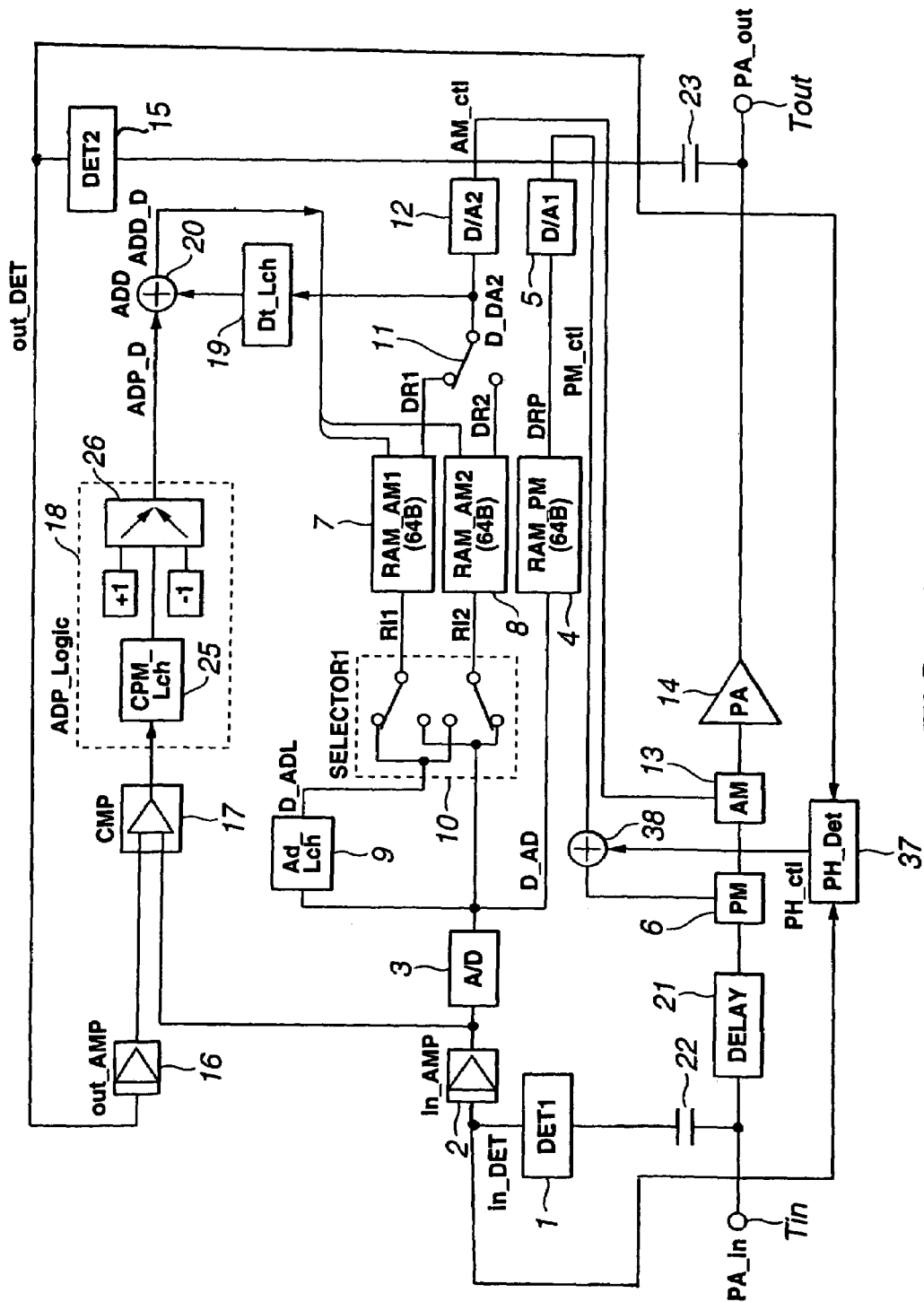
FIG. 14 is a structural view showing the adaptive distortion compensation apparatus as the seventh embodiment.

Next, a seventh embodiment will be explained. FIG. 14 shows a block diagram of the adaptive distortion compensation apparatus as the seventh embodiment. In contrast to the adaptive distortion compensation apparatus of the first embodiment shown in FIG. 3, the adaptive distortion compensation apparatus of the seventh embodiment comprises a phase difference detection section (PH_det) 37. A phase difference between the input signal PA_in and the output signal PA_out is detected from part of both signals, and a voltage PH_ct1 proportional to this phase difference is outputted. Further, the voltage PH_ct1 outputted from the phase difference detection section 37 and the phase control signal PM_ct1 are subjected analogue addition by the adder 38, and the result PM_ct1_add is used as the control signal for the phase control section 6.

The operation will now be explained. In general, the power amplifier 14 has phase distortion which serves as a factor causing the distortion. It is considered that, as the operation temperature of the power amplifier 14 changes, the phase transition also changes. Therefore, the phase difference between high-frequency components of the input and output signals is detected, in order to perform adaptive compensation on the phase transition. The voltage as a result thereof is added to the signal PM_ct1 read and obtained from the memory 4, to make correction. In this manner, adaptive compensation is preformed on the phase transition.

Figure 15:
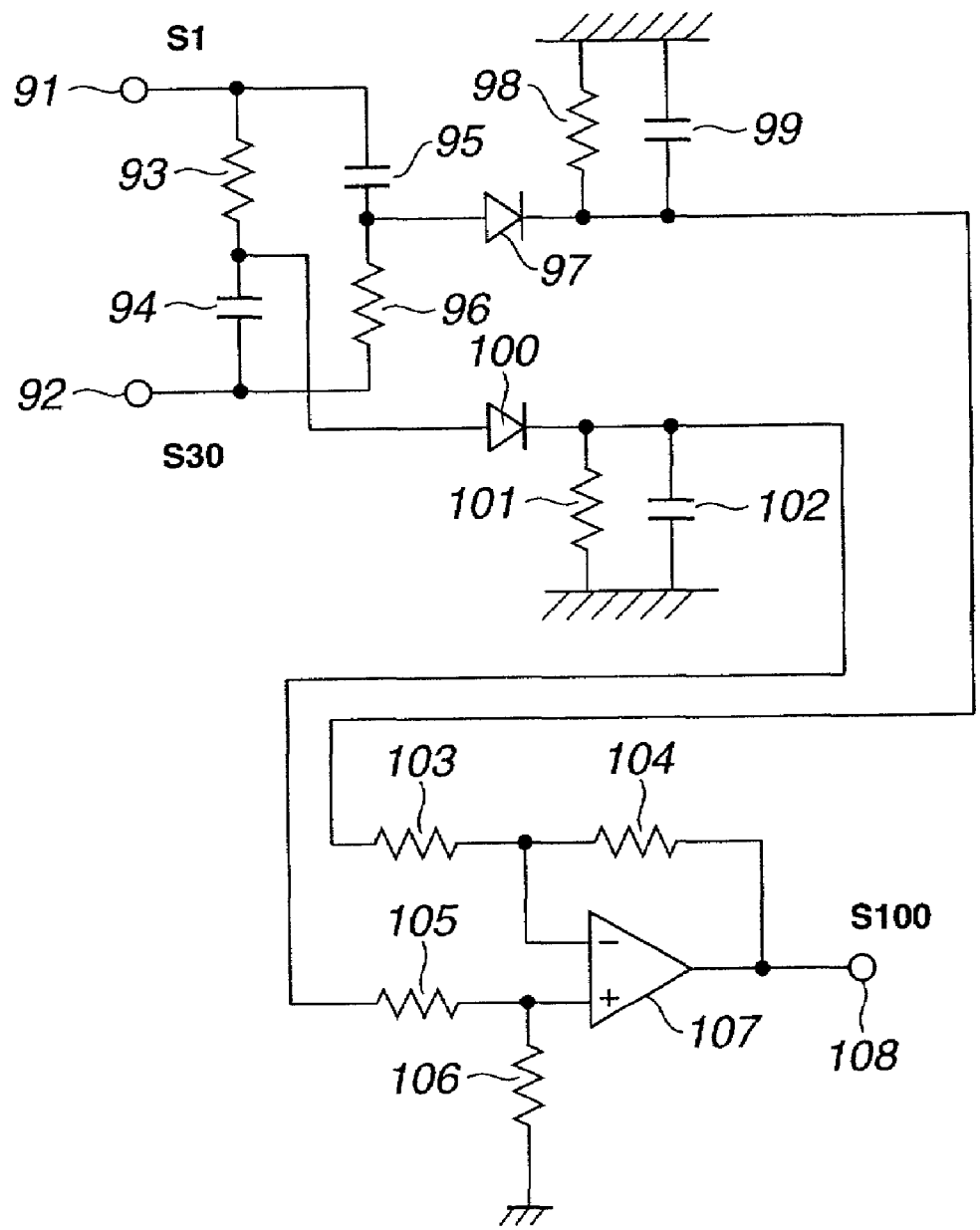
FIG. 15 is a circuit diagram showing a specific example of a phase difference detection section which forms part of the adaptive distortion compensation apparatus as the seventh embodiment.

FIG. 15 shows a specific example of the phase difference detection section 37. A resistor 93 and a capacitor 94 connected in series and a capacitor 95 and a resistor 96 also connected in series are connected in parallel to construct a bridge. Two opposite terminals 91 and 92 of the bridge are used as input terminals and are inputted with two signals (S1 and S30) which should be subjected to detection for a phase difference between each other. Then, a voltage corresponding to the phase difference appears another set of opposite terminals. Therefore, these opposite terminals are respectively connected with two square wave detection circuits which are constructed by diodes 97 and 100, resistors 98 and 101, and capacitors 99 and 102. The outputs of the circuits are each inputted to a subtracter. This subtracter uses a calculation amplifier 107 and receives the output of the first square wave circuit comprised of the diode 97, resistor 98, and capacitor 99, through a resistor 103, at an inverted terminal (−) of the calculation amplifier 107 as well as the output of the second square wave detection circuit comprised of the diode 100, resistor 101, and capacitor 102, through a resistor 105, at a positive terminal (+) of the calculation amplifier 107. A resistor 104 is connected between the inverted terminal (−) of the calculation amplifier 107 and an output terminal. A resistor 106 is connected between the positive terminal (+) of the calculation amplifier 107 and the ground.

An output S100 which appears at the output terminal 108 will be as follows, where the outputs of the first and second square wave detection circuits are respectively expressed as Vi1 and Vi2, and the values of the outputs of the resistors 103, 104, 105, and 106 are respectively expressed as R1, R2, R3, and R4.

$$S100=(R4/R3)Vi2-(R2/R1)\,Vi1 \quad (6)$$

Where R1=R2=R3=R4 is given, the above equation (6) changes into the next equation (7).

$$V0=Vi2-Vi1 \quad (7)$$

That is, the signal S100 is proportional to the phase difference between two input signal voltages S1 and S30.

As has been explained above, the adaptive distortion compensation apparatus in each of the above embodiments enables data for adaptive compensation necessary for pre-distortion with no use of orthogonal demodulation, with use of a method of envelope detection for distortion component of the power amplifier 14. In addition, the distortion component is detected by multiplication of a difference between input and output, to perform distortion compensation. Therefore, even a slight distortion component can be compensated for. In addition, since only codes are determined to perform adaptive compensation, a slight voltage signal need not be dealt with, and simultaneously, an A/D converter for a large number of bits is not needed. In any cases, great advantages can be obtained.

What is claimed is:

1. A distortion compensation apparatus for compensating for a distortion component generated in a device, comprising:
    first envelope detection means for detecting an input envelope voltage of an input signal supplied to the device;
    second envelope detection means for detecting an output envelope voltage of an output signal of the device;
    comparison means for comparing the input envelope voltage detected by the first envelope detection means with the output envelope voltage detected by the second envelope detection means;
    comparison result correction means for correcting a relationship corresponding to a result of the comparison made by the comparison means indicating which of the envelope voltages is larger;
    amplitude control signal generation means for generating an amplitude control signal for controlling an amplitude of the input signal based on a correction output of the comparison result correction means; and
    amplitude control means for controlling a gain of the amplitude of the input signal based on the amplitude control signal generated by the amplitude control signal generation means, wherein the comparison result correction means latches the comparison result of the comparison means, and corrects and outputs one of a digital +1 bit and a digital −1 bit based on a latch value of the result of latching.

2. The apparatus according to claim 1, wherein the amplitude control signal generation means includes amplitude correction data output means for outputting data for amplitude correction in correspondence with the input envelope voltage detected by the first envelope detection means, and for updating the data for amplitude correction based on the correction output of the comparison result correction means.

3. The apparatus according to claim 2, wherein the amplitude correction data output means is a writable storage medium that stores the data for amplitude correction.

4. The apparatus according to claim 3, wherein the amplitude correction data output means comprises two writable storage media.

5. The apparatus according to claim 4, wherein the two writable storage media alternately perform reading and updating of the data for amplitude correction.

6. The apparatus according to claim 1, further comprising:
    phase control signal generation means for generating a phase control signal for controlling a phase of the input signal in correspondence with the input envelope voltage detected by the first envelope detection means; and
    phase control means for controlling the phase of the input signal based on the phase control signal generated by the phase control signal generation means.

7. The apparatus according to claim 6, wherein the amplitude control signal generation means includes amplitude correction data output means for outputting data for amplitude correction in correspondence with the input envelope voltage detected by the first envelope detection means, and for updating the data for amplitude correction based on the correction output of the comparison result correction means.

8. The apparatus according to claim 7, wherein the amplitude correction data output means is a writable storage medium that stores the data for amplitude correction.

9. The apparatus according to claim 8, wherein the amplitude correction data output means comprises two writable storage media.

10. The apparatus according to claim 9, wherein the two writable storage media alternately perform reading and updating of the data for amplitude correction.

11. A distortion compensation apparatus for compensating for a distortion component generated in a device, comprising:
    first envelope detection means for detecting an input envelope voltage of an input signal supplied to the device;
    second envelope detection means for detecting an output envelope voltage of an output signal of the device;

calculation means for calculating a difference between the input envelope voltage detected by the first envelope detection means and the output envelope voltage detected by the second envelope detection means;

comparison means for comparing the difference calculated by the calculation means with a predetermined reference value;

comparison result correction means for correcting a relationship corresponding to a result of the comparison made by the comparison means indicating which of the difference and the reference value is larger;

amplitude control signal generation means for generating an amplitude control signal for controlling a gain of an amplitude of the input signal based on a correction output of the comparison result correction means; and amplitude control means for controlling the gain of the amplitude of the input signal based on the amplitude control signal generated by the amplitude control signal generation means, wherein the comparison result correction means latches the comparison result of the comparison means, and corrects and outputs one of a digital +1 bit and a digital −1 bit based on a latch value of the result of latching.

12. The apparatus according to claim 11, wherein the amplitude control signal generation means includes amplitude correction data output means for outputting data for amplitude correction in correspondence with the input envelope voltage detected by the first envelope detection means, and for updating data for amplitude correction based on the correction output of the comparison result correction means.

13. The apparatus according to claim 12, wherein the amplitude correction data output means is a writable storage medium that stores the data for amplitude correction.

14. The apparatus according to claim 13, wherein the amplitude correction data output means comprises two writable storage media.

15. The apparatus according to claim 14, wherein the two writable storage media alternately perform reading and updating of the data for amplitude correction.

16. The apparatus according to claim 11, wherein the comparison means comprises two comparators for comparing the difference calculated by the calculation means with predetermined reference values to obtain two comparison results.

17. The apparatus according to claim 16, wherein the comparison result correction means corrects a relationship corresponding to the two comparison results indicating which of the difference and the reference values is larger.

18. The apparatus according to claim 16, further comprising:

phase control signal generation means for generating a phase control signal for controlling a phase of the input signal in correspondence with the input envelope voltage detected by the first envelope detection means; and phase control means for controlling the phase of the input signal based on the phase control signal generated by the phase control signal generation means.

19. The apparatus according to claim 11, further comprising:

phase control signal generation means for generating a phase control signal for controlling a phase of the input signal in correspondence with the input envelope voltage detected by the first envelope detection means; and phase control means for controlling the phase of the input signal based on the phase control signal generated by the phase control signal generation means.

20. A distortion compensation apparatus for compensating for a distortion component generated in a device, comprising:

first envelope detection means for detecting an input envelope voltage of an input signal supplied to the device;

second envelope detection means for detecting an output envelope voltage of an output signal of the device;

comparison means for comparing the input envelope voltage detected by the first envelope detection means with the output envelope voltage detected by the second envelope detection means;

comparison result correction means for correcting a relationship corresponding to a result of the comparison made by the comparison means indicating which of the envelope voltages is larger;

amplitude control signal generation means for generating an amplitude control signal for controlling an amplitude of the input signal based on a correction output of the comparison result correction means; and amplitude control means for controlling a gain of the amplitude of the input signal based on the amplitude control signal generated by the amplitude control signal generation means, wherein the comparison result correction means latches the comparison result of the comparison means, and corrects and outputs one of a +1 bit and a −1 bit based on a latch value of the result;

phase control signal generation means for generating a phase control signal for controlling a phase of the input signal in correspondence with the input envelope voltage detected by the first envelope detection means; and phase control means for controlling the phase of the input signal based on the phase control signal generated by the phase control signal generation means, wherein the comparison result correction means latches the comparison result of the comparison means, and corrects and outputs one of a digital +1 bit and a digital −1 bit based on a latch value of the result of latching.

21. A distortion compensation apparatus for compensating for a distortion component generated in a device, comprising:

first envelope detection means for detecting an input envelope voltage of an input signal supplied to the device;

phase control signal generation means for generating a phase control signal for controlling a phase of the input signal in correspondence with the input envelope voltage detected by the first envelope detection means;

phase control means for controlling the phase of the input signal based on the phase control signal generated by the phase control signal generation means;

second envelope detection means for detecting an output envelope voltage of an output signal of the device;

phase difference detection means for detecting a phase difference between the input envelope voltage detected by the first envelope detection means and the output envelope voltage detected by the second envelope detection means;

addition means for adding the phase difference detected by the phase difference detection means to the phase control signal generated by the phase control signal generation means, and for supplying an addition result to the phase control means;

comparison means for comparing the input envelope voltage detected by the first envelope detection means with the output envelope voltage detected by the second envelope detection means;

comparison result correction means for correcting a relationship corresponding to a result of the comparison made by the comparison means indicating which of the envelope voltages is larger;

amplitude control signal generation means for generating an amplitude control signal for controlling an amplitude of the input signal based on a correction output of the comparison result correction means; and amplitude control means for controlling a gain of the amplitude of the input signal based on the amplitude control signal generated by the amplitude control signal generation means, wherein the comparison result correction means latches the comparison result of the comparison means, and corrects and outputs one of a digital +1 bit and a digital −1 bit based on a latch value of the result of latching.

22. The apparatus according to claim 21, wherein the amplitude control signal generation means includes amplitude correction data output means for outputting data for amplitude correction in correspondence with the input envelope voltage detected by the first envelope detection means, and for updating the data for amplitude correction based on the correction output of the comparison result correction means.

23. The apparatus according to claim 22, wherein the amplitude correction data output means is a writable storage medium that stores the data for amplitude correction.

24. The apparatus according to claim 23, wherein the amplitude correction data output means comprises two writable storage media.

25. The apparatus according to claim 24, wherein the two writable storage media alternately perform reading and updating of the data for amplitude correction.

* * * * *